United States Patent [19]
Matsuzoe

[11] Patent Number: 5,526,936
[45] Date of Patent: Jun. 18, 1996

[54] TRAY ASSEMBLY FOR TRANSPORTING PRECISION DEVICES

[75] Inventor: Noriho Matsuzoe, Nishinomiya, Japan

[73] Assignee: Gold Industries Co., Ltd., Osaka, Japan

[21] Appl. No.: 354,902

[22] Filed: Dec. 12, 1994

[30] Foreign Application Priority Data

Dec. 27, 1993 [JP] Japan ............................ 5-351637
Aug. 26, 1994 [JP] Japan ............................ 6-225617

[51] Int. Cl.⁶ ...................................... B65D 73/02
[52] U.S. Cl. .................... 206/724; 206/726; 206/728; 206/560
[58] Field of Search ..................... 206/716, 724, 206/726, 728, 504, 560

[56] References Cited

U.S. PATENT DOCUMENTS

| | | | |
|---|---|---|---|
| 3,892,312 | 7/1975 | Tems | 206/724 |
| 4,133,445 | 1/1979 | Mandelbaum | 206/504 |
| 4,379,505 | 4/1983 | Alemanni | 206/724 |
| 4,591,053 | 5/1986 | Alemanni | 206/724 |
| 4,753,003 | 6/1988 | Gobeil | 206/716 |
| 4,991,714 | 2/1991 | Clatanoff | 206/724 |
| 5,026,303 | 6/1991 | Matsuoka et al. | 206/724 |
| 5,066,245 | 11/1991 | Walker | 206/724 |
| 5,375,710 | 12/1994 | Hayakawa et al. | 206/724 |

*Primary Examiner*—David T. Fidei
*Attorney, Agent, or Firm*—Edwin E. Greigg; Ronald E. Greigg

[57] ABSTRACT

Each of trays forming a tray assembly has a main body having a recess for holding an article to be transported. Connectors protruding from a front and rear sides of the main body mate with each other so that the trays are linked to be flexible relative to each other. Elastic and rockable members formed integral with each main body have locking pawls capable of engaging with the article. Each locking pawl integral with the rockable member and positioned in the recess is always urged to engage with and hold in place the article, such that the pawls can be elastically retracted for an easier loading and unloading of the articles onto and from the recesses.

5 Claims, 12 Drawing Sheets

TRAY ASSEMBLY FOR TRANSPORTING PRECISION DEVICES

BACKGROUND OF THE INVENTION

1. Field of the Invention

The present invention relates to a tray assembly comprising a plurality of linked trays adapted for holding and transporting semiconductor devices such as integrated circuit chips, memory chips, other electronics devices (for example, connectors, switches, transmitters or the like), or comparatively small parts incorporated in precision parts (hereinafter inclusively referred to as 'IC chips'), wherein the IC chips take their individual and discrete places within the tray assembly.

2. Description of Prior Art

The important or principal electronic circuits are delivered nowadays in the form of the so-called 'chip' in order to improve their operation reliability as well as the efficiency of assembly plants. Preliminary and/or final assembly lines are supplied with the IC chips which are arrayed in a considerably large transporting container, which has a plurality of chip-holding recesses forming longitudinal and transverse rows. Generally, a robot hand or the like equipped beside one side of a transporting route supplies the IC chips one by one from the large container to the assembly line. Therefore, the robot hand must reciprocate a long distance in order to pick up the IC chip positioned near the other side of the transporting route. Consequently, an average waiting time for the assembly line to receive the individual IC chips becomes long to thereby lower the production efficiency. Further, the robot hand must change its position every time when it picks up the IC chips. In the event that the robot hand fails to grip any IC chip at its correct portion, the IC chip would be broken and the assembly line would be disturbed seriously. In order to avoid such an incident, the position control of robot hand should be so accurate as undesirably raising the control system cost.

SUMMARY OF THE INVENTION

An object of the present invention made in view of such a drawback is therefore to provide a tray assembly that comprises a plurality of trays each being a compact and one-piece molded article capable of being linked together to form a chain-like band for transporting precision devices in a manner such that a robot hand can easily handle them, in which each tray has two or more elastic and rockable members whose locking pawls for holding in place the precision device on the tray are automatically retracted away from the precision device when it is put into or out of the tray.

According to the present invention, the tray assembly comprises a plurality of trays each being one-piece mold of a plastics and having a main body (2), male and female connectors (5, 6) integral therewith and at least two elastic rockable means (13, 7) also integral with the main body. The main body (2) has between its first opposite sides and between second opposite sides a recess (1) for holding in place an article (B) to be transported, and the male and female connectors (5, 6) extend outwardly from the first opposite sides extending transversely of a direction in which the trays are connected flexibly relative to each other. The elastic rockable means (13, 7) respectively comprise locking pawls (16, 7c) integral therewith and positioned in the recess (1) of each main body (2), with the locking pawls always being urged towards the article (B) so as to engage it.

In a first mode of the present invention, the elastic rockable means may be a pair of rocking plates (13) extending fore and aft or upright along inner surfaces of side walls (11) disposed in parallel with the second opposite sides. Each rocking plate (13) has, between its opposite ends, a middle portion formed as a fulcrum (12) extending from the side wall (11), whereby the plate can elastically rock about the fulcrum in a manner like a seesaw. One of the opposite ends of the plate (13) is shaped to provide a contact (15) protruding outwardly of the recess (1) through an opening (14) formed in the wall. The other end opposite to the contact is shaped to provide the locking pawl (16) protruding inwardly of the recess (1). In an alternative mode of the present invention, the elastic rockable means may be at least one pair of plate members (7) located diagonally to face one another and formed integral with a bottom (8) of the main body (2). Each plate member (7) consists of a pair of inner and outer elastic feet (7a), a bridge (7b) integral with tops of the feet, and the locking pawl (7c) formed as an inner end of the bridge so as to face a center of the bottom. The elastic feet (7a) standing upright on the bottom (8) are aligned on a diagonal line and disposed in parallel with each other.

The trays (A) of the described structure will be connected one to another by means of the female and male connectors (5, 6), for use in the form of a chain-like elongate tray assembly shown in FIG. 6. This assembly will be driven in and along a shallow guide groove (18), whose width corresponds to the tray assembly's width defined between the second opposite sides of each recess (1). When the foremost tray arrives at dogs (19) formed along the opposite edge portions of the guide groove (18), the contacts (15) of the rocking plates (13) will come into engagement with the dogs (19) so that each plate (13) rocks about the fulcrum (12). The locking pawl (16) will thus be retracted outwardly in a seesaw-like manner so as not to hinder an IC chip (B) from being smoothly put into the recess (1), as will be seen in FIG. 4. As the tray assembly further advances, the foremost tray (A) will move past the dogs (19) and they will disengage from the rocking plates (13), thereby allowing the locking pawls to take their home position overlying the side edges of said IC chip. Thus, the IC chips are held in position until they are positively unloaded from the tray assembly at an unloading station located on an automatic manufacture line. This unloading station may likewise comprise a guide groove and dogs which will forcibly retract the locking pawls (16) away from their home position to enable a smooth unloading of the IC chips. In a case shown in FIG. 12 wherein the rockable means are the plate members (7) each comprising the elastic feet (7a) erected on the bottom (8), and the bridge (7b) connecting the tops of feet together and having the locking pawl (7c), corners of an IC chip (B) will collide with the pawls to cause the elastic feet to rock about their basal portions integral with the bottom, as shown with the phantom lines in FIG. 15. This rocking motion is of an elastic nature and takes place centrifugally and then centripetally of the recess (1), so that the IC chip can be easily put thereinto and readily withdrawn therefrom. Further, the position of IC chip received and retained in the recess is so stable that it will never unintendedly slip off the tray.

DETAILED DESCRIPTION OF THE PREFERRED EMBODIMENTS

Figure 1:
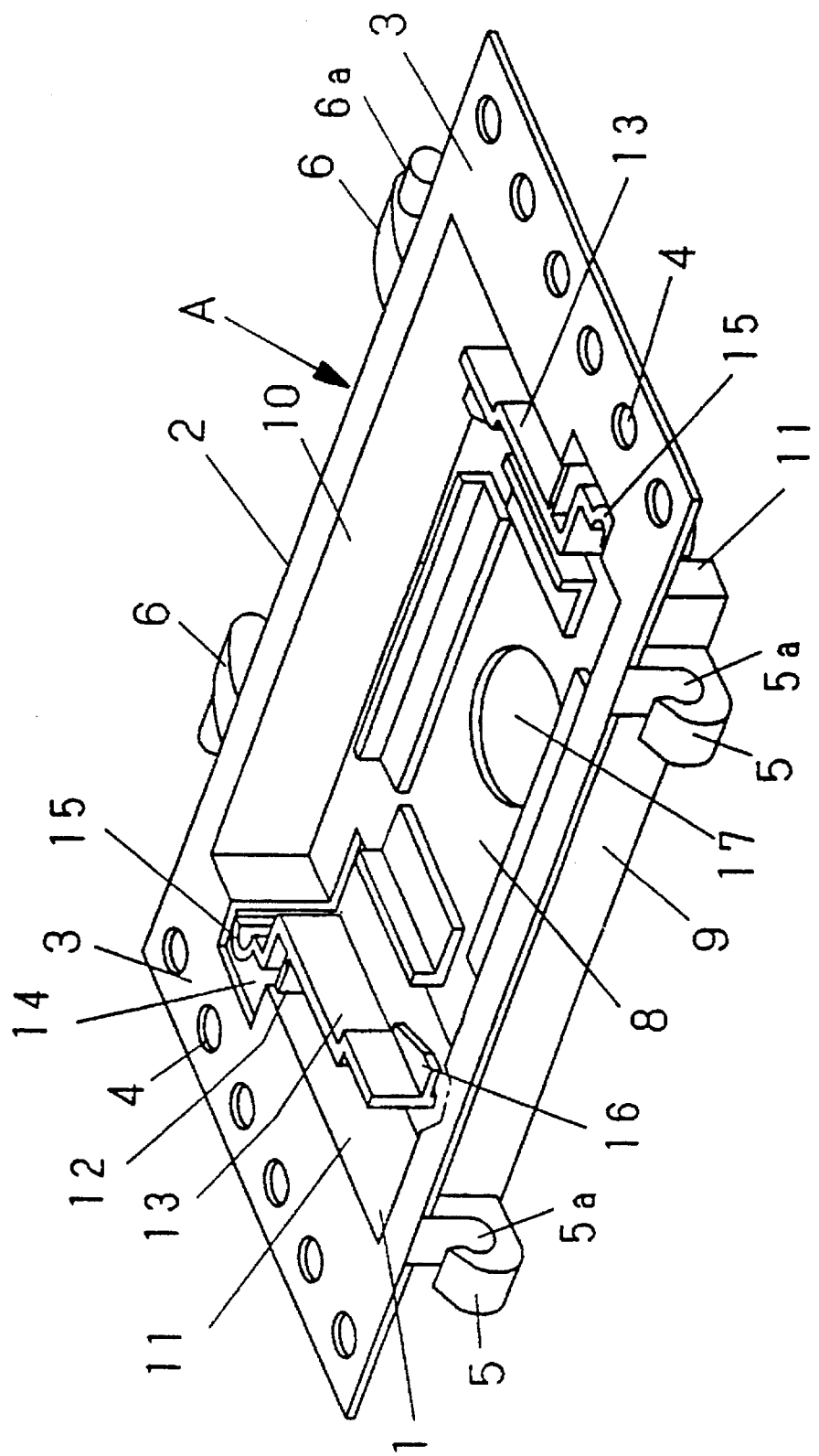
FIG. 1 is a perspective view of a tray in a first embodiment.
Figure 2:
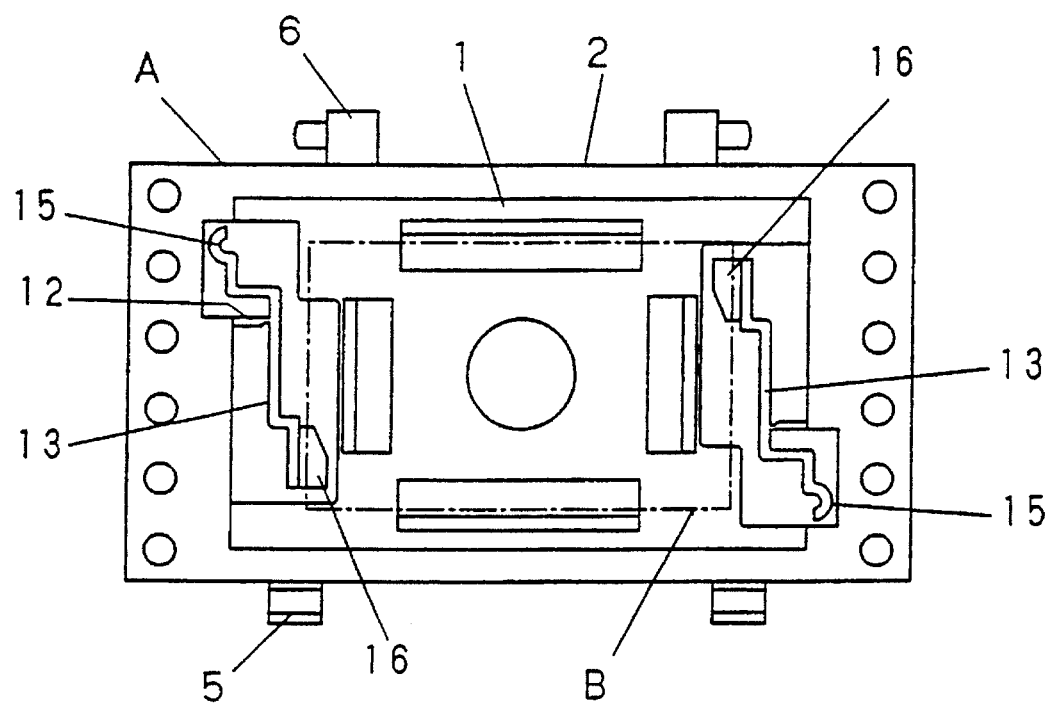
FIG. 2 is a plan view of the tray.
Figure 3:
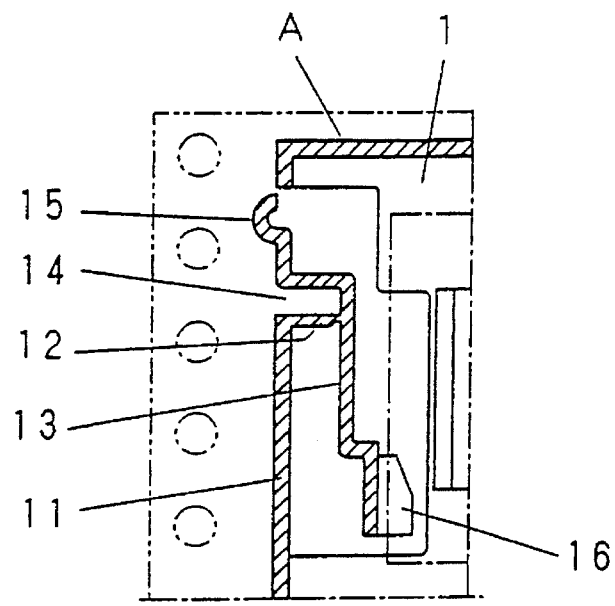
FIG. 3 is an enlarged cross section of essential parts of the tray.

Now some embodiments of the present invention will be described referring to the drawings. In FIGS. 1 to 6 showing a tray 'A' and an assembly of the trays 'A' each receiving a rectangular IC chip 'B' to be transported. The tray 'A' comprises a main body 2 having a recess 1 to accommodate the IC chip, and is a one-piece mold of a plastics. A preferable example of the plastics is a polyacetal resin (viz. 'POM'). The dimension of the recess 1 is such that fingers of a robot hand can go in between the IC chip and a wall defining the recess 1. For example, each recess 1 is 20 mm long and 30 mm wide in the illustrated embodiment.

The main body 2 of the tray has a left-hand and right-hand vertical walls 11 whose upper ends protrude sideways to provide a left-hand and right-hand flanges 3, respectively. Small apertures 4 are opened through each flange 3 at regular intervals so as to engage with a sprocket or the like which drives the assembly of trays to make strokes. Small lugs may substitute for the small apertures. A front wall 9, as one of first opposite sides of the main body 2, has a pair of left and right female connectors 5, and correspondingly a rear wall 10 as the other first side has a pair of male connectors 6. Those connectors 5 and 6 protrude horizontally from and perpendicular to the front and rear walls so as to engage one another to form the assembly of a chain-like configuration, in which the adjacent trays are flexible relative to each other.

Each of the female connectors 5 is generally U-shaped in cross section to define a cavity 5a having a slightly constricted top opening. Each male connector 6 comprises a horizontal pin 6a protruding sideways therefrom. The pin 6a is of such a diameter that it can fit in the cavity 5a, through the constricted opening thereof. Thus, one tray can be adjoined to the other to easily provide the assembly of trays, by forcing the pins 6a of the one tray into the cavities 5a of the other, wherein the constricted openings will be temporarily and reversibly expanded by the pins. The constricted width of the top opening of each cavity 5a is effective to retain the pin 6a, lest one tray should disengage from the others during movement of the tray assembly. However the trays can be separated readily from each other, if so desired, by forcibly raising the pins 6a out of the cavities 5a, against an elastic force of the constricted openings.

Formed along second opposite side walls of the trays's recess 1 are a pair of left-hand and right-hand rocking plates 13 extending fore and aft as the elastic rockable means employed in this embodiment. Each rocking plate has, between its opposite ends, a middle portion formed as a fulcrum 12 extending from the side wall 11, whereby the plate can elastically 'seesaw' about the fulcrum. One of the opposite ends of the plate 13 is shaped as a contact 15 protruding outwardly of the recess 1 through an opening 14 formed in the wall. The other end opposite to the contact is shaped as a locking pawl 16 protruding inwardly of said recess. Although the locking pawls 16 of the rocking plates 13 are arranged on a diagonal line, they may be located side by side to face one another. A central aperture 17 formed through a bottom 8 of the main body 2 allows a tool to eject upwards the IC chip out of the tray.

Figure 4:
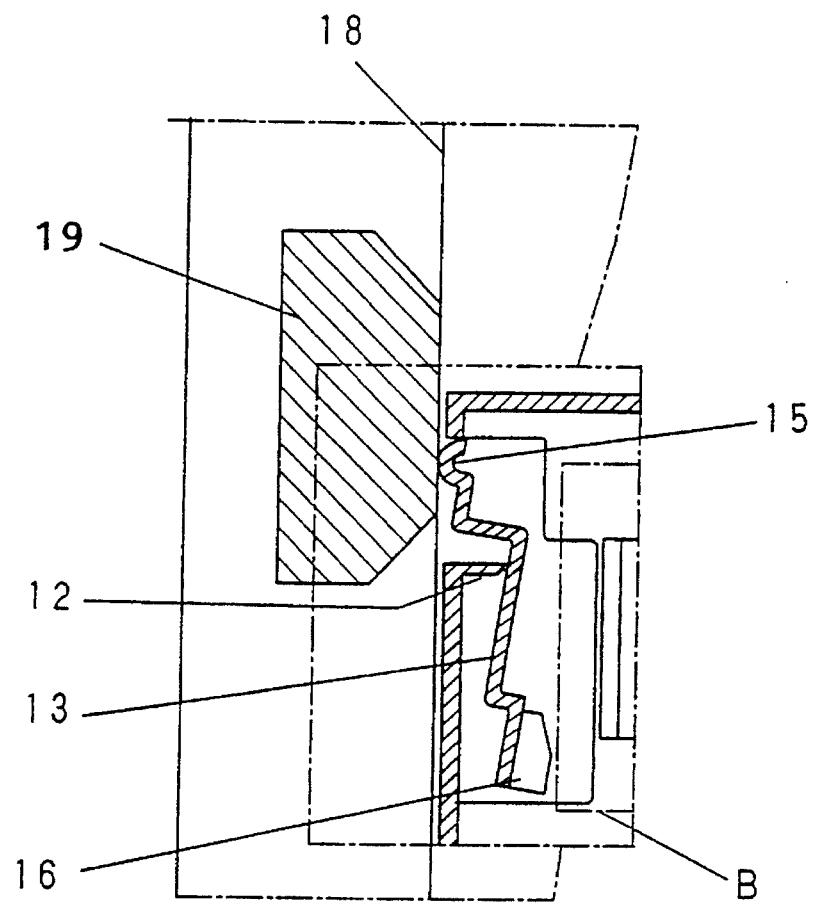
FIG. 4 is also an enlarged cross section of a locking pawl, in its rocking state.
Figure 5:
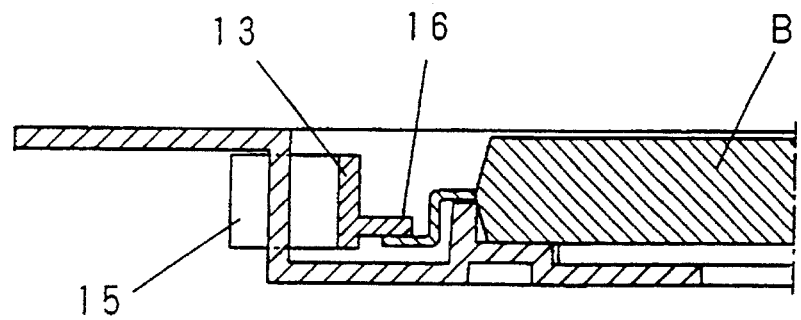
FIG. 5 is similarly an enlarged cross section of the pawl, in its locking state.
Figure 6:
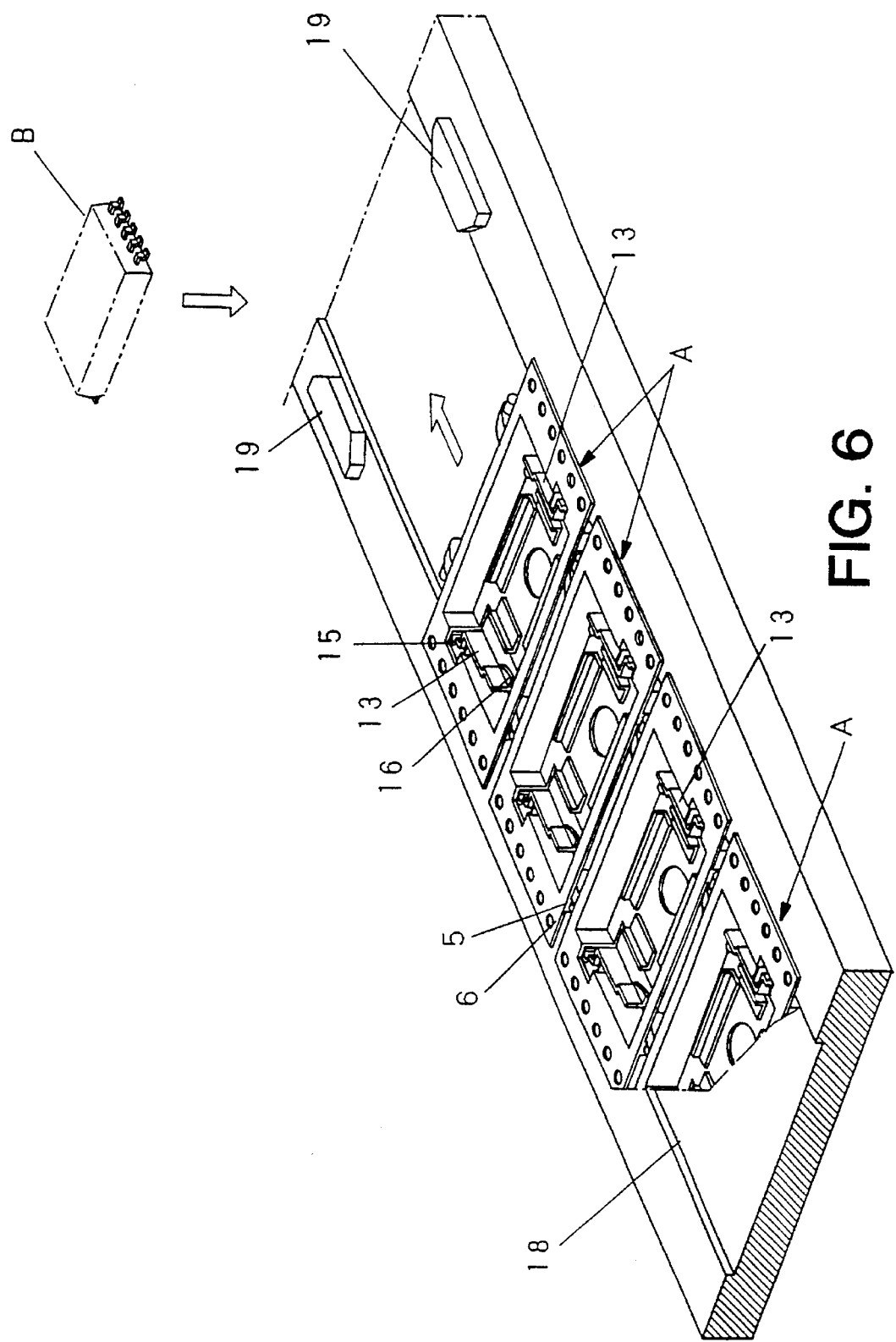
FIG. 6 is a perspective view of an assembly which consists of a plurality of the trays connected one to another in a chain-like manner.
Figure 7:
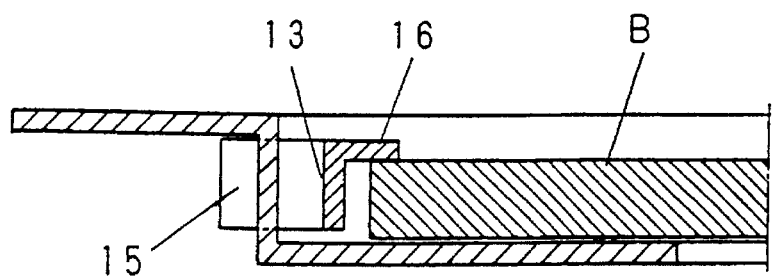
FIG. 7 is a cross section corresponding to FIG. 5 and showing the locking pawl of a modified type.

The trays 'A' of the described structure will be connected one to another by means of the female and male connectors 5 and 6, for use in the form of a chain-like elongate tray assembly shown in FIG. 6. This assembly will be driven in and along a shallow guide groove 18, whose width corresponds to the tray assembly's width defined between the second opposite side walls of each recess 1. The depth of the guide groove 18 is designed such that the contacts 15 will not interfere with side walls of said groove. Dogs 19 each having an inner surface flush with the side wall of the guide groove are disposed at a loading station. When the foremost tray arrives at the loading station, the contacts 15 of the rocking plates 13 engage with the dogs 19 so that each plate 13 rocks about the fulcrum 12, in a seesaw-like manner as shown in FIG. 4. Each locking pawl 16 will thus be retracted outwardly so as not to hinder an IC chip 'B' from being smoothly put into the recess 1 of the tray. As the tray assembly further advances, the foremost tray 'A' will move past and disengage from the dogs 19, thereby allowing the locking pawls 16 to elastically return to their home position overlying the side edges of said IC chip. Thus, the IC chips are held in position until they are positively unloaded from the tray assembly at an unloading station located on an automatic manufacture line. This unloading station may likewise comprise a similar guide groove and similar dogs 19, with the latter cooperating with the contacts which will also forcibly retract the locking pawls 16 away from their home position to enable a smooth unloading of the IC chips.

It will be understood that the recess 1 formed in the tray's main body 2 can be of any shape to match the shape of articles which are to be accommodated. Further, the locking pawl 16 of each rocking plate 13 may protrude from any vertical portion thereof, also corresponding to the shape of said articles.

Figure 9:
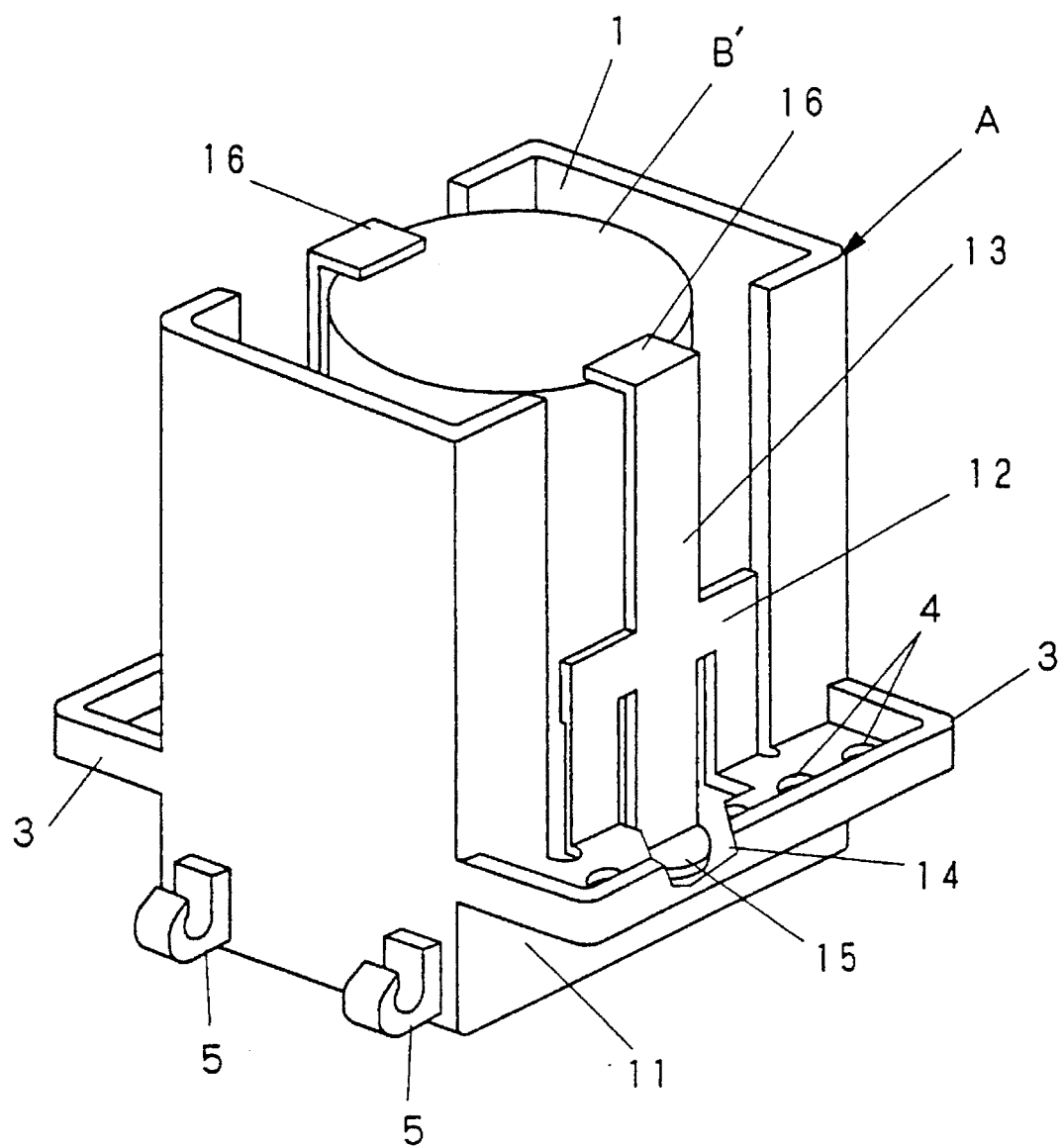
FIG. 9 is a perspective view of another tray in a second embodiment.
Figure 10:
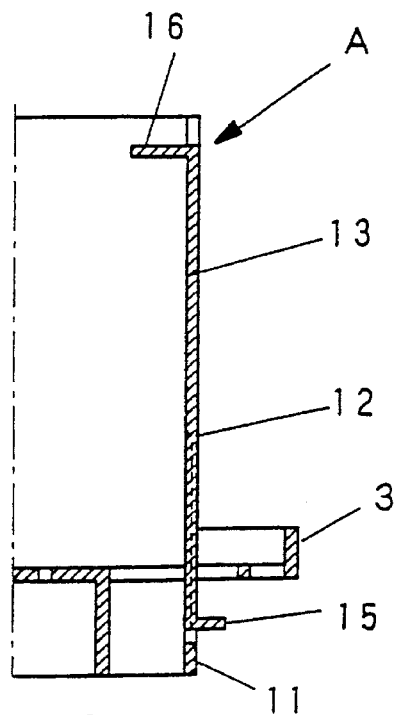
FIG. 10 is a partial vertical cross section of the tray shown in FIG. 9.
Figure 11:
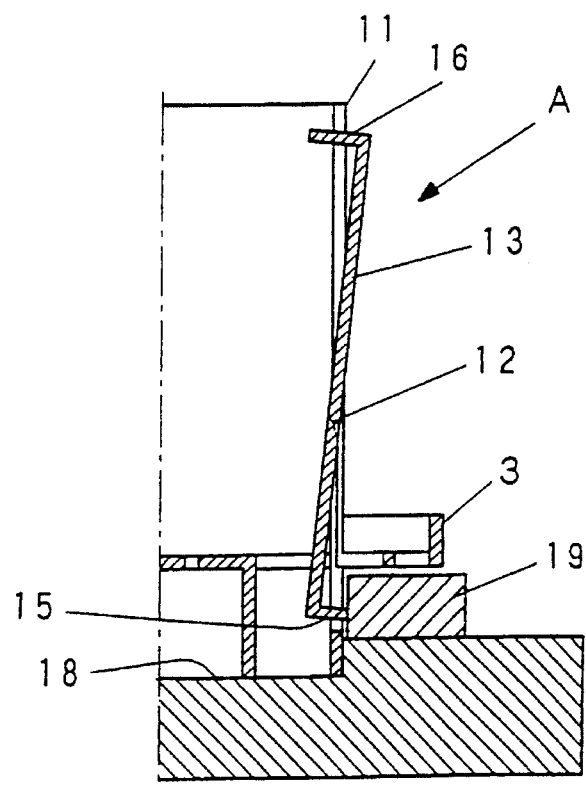
FIG. 11 is an enlarged cross section a locking pawl in the second embodiment, in its rocking state.
Figure 12:
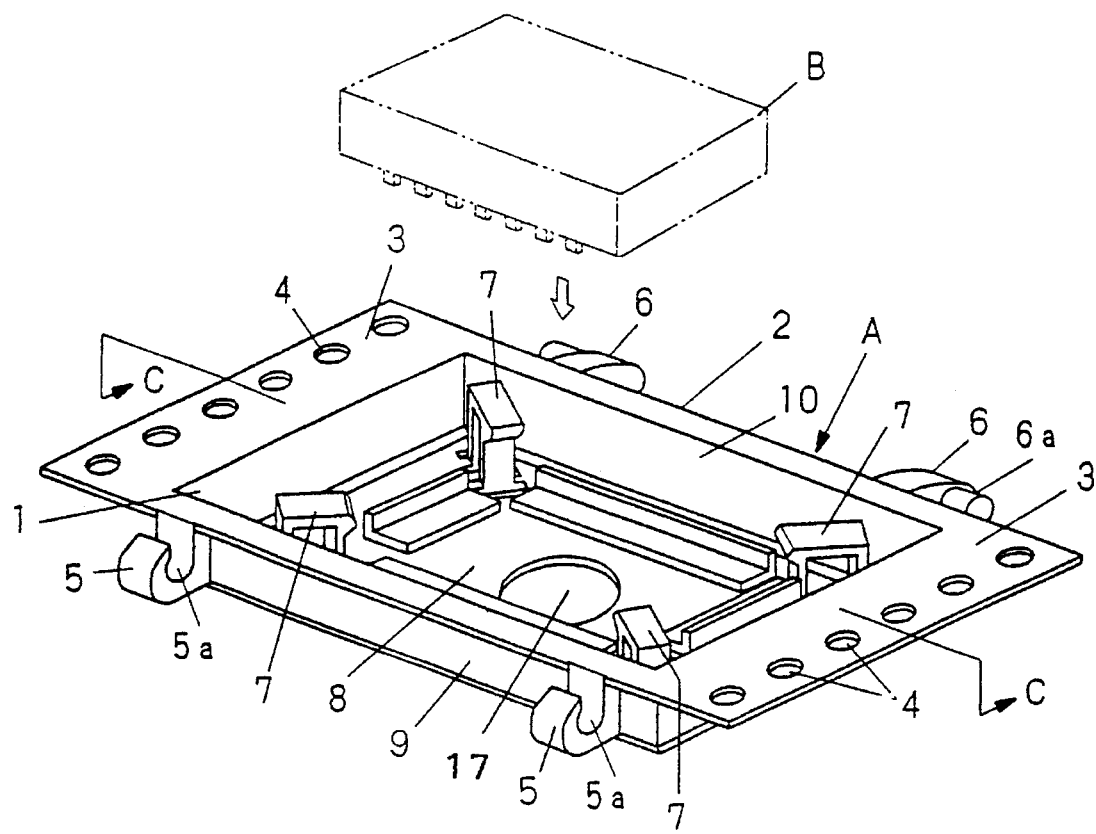
FIG. 12 is a perspective view of still another tray in a third embodiment.
Figure 13:
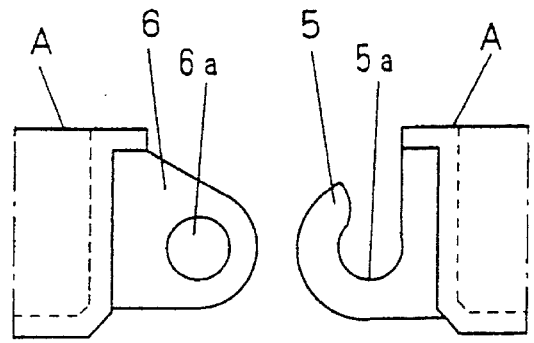
FIG. 13 is an enlarged side elevation of female and male connectors which the tray shown in FIG. 12 comprises.
Figure 14:
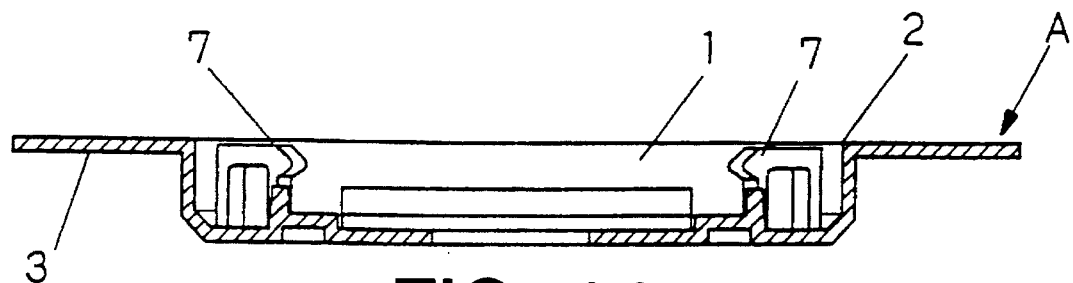
FIG. 14 is a cross section taken along the line C—C in FIG. 12.
Figure 15:
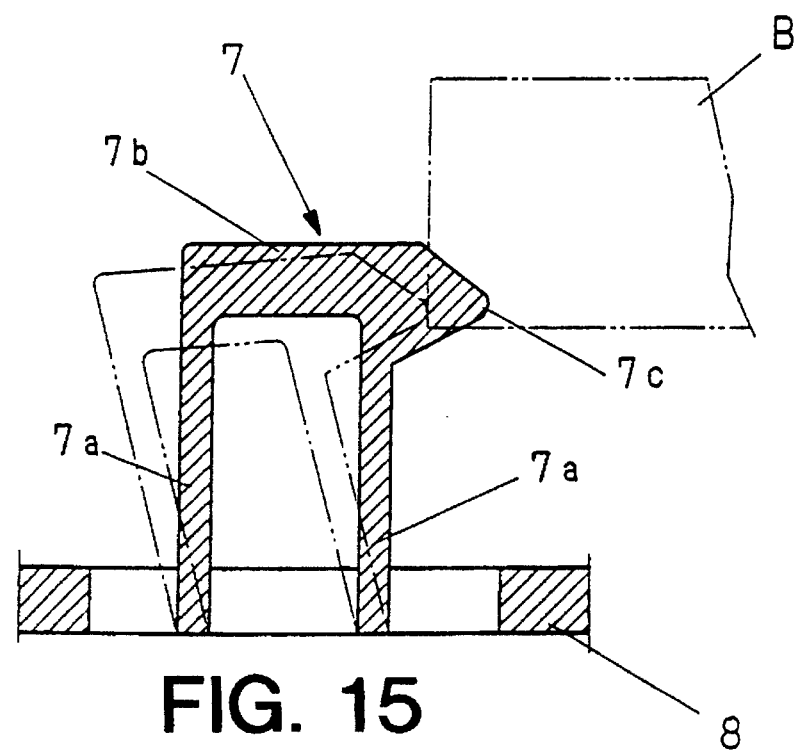
FIG. 15 is a cross section of a locking pawl employed in the third embodiment and shown in its rocking state.

In a second embodiment shown in FIGS. 9 to 11, the tray 'A' is adapted to hold a cylindrical part 'B' such as an electric condenser. Each rocking plate 13 in this case is elongate in vertical direction, and is also rockable like a seesaw about a fulcrum portion 12 formed at its middle height. A contact 15 formed at a lower end of the rocking plate 13 is exposed to the outside through an opening 14 formed in a side wall 11. A locking pawl 16 protrudes inwardly from an upper end of the rocking plate. A tray assembly composed of such trays will likewise advance in and along a guide groove 18 comprising dogs 19 at a loading station, similarly to the first embodiment. When the foremost tray arrives at the loading station, the contacts 15 of the rocking plates 13 engage with the dogs 19 so that each plate 13 seesaws about the fulcrum 12. Each locking pawl 16 will thus be retracted outwardly so as not to hinder the cylindrical article (B') from being smoothly put into the tray's recess. As the tray assembly further advances, the foremost tray 'A' will move past and disengage from the dogs 19, thereby allowing each rocking plate 13 to elastically return to its home position, with its locking pawls 16 engaging a top edge of each article. Thus, those articles (B') are surely held in position in a manner shown in FIG. 9, until they are positively unloaded.

In a third embodiment shown in FIGS. 12 to 17, trays 'A' each having plate members 7 as the rockable means are linked one to another in a chain-like manner by their female and male connectors 5 and 6. When an IC chip 'B' is accommodated in the tray's recess 1, locking pawls 7c of the plate members 7 will collide with lower corner edges of the IC chip. Elastic feet 7a of the plate members 7 will rock about their basal portions so as to be slanted outwardly and elastically, thereby displacing the pawls 7c to allow the IC chip to enter the recess as shown at the phantom lines in FIG. 15. With the locking pawls 7c clicking over the chip's corner edges, the elastic feet 7a return to their upright position so that the pawls hold the IC chip 'B' in place.

In this embodiment, a bridge 7b is integral with tops of the feet, and the locking pawl 7c is formed as an inner end of the bridge 7b. The elastic and parallel feet 7a standing upright on the bottom 8 allow the bridge 7b to make a translational displacement in parallel with the bottom. Thus, the pawl 7c can move a considerable distance towards and away from the center of this tray. The elastic feet 7b afford a strong retentive force to the locking pawls engaging the IC chip. Thanks to this feature, the IC chips accommodated in the trays can be of a size variable within a considerable range. The locking pawls arranged at the corners of the tray allow the robot arm to make a free access to the IC chips to be unloaded on the automatic manufacture line. The robot arm can grip each IC chip at its front and rear sides, or at its left and right sides.

Figure 16:
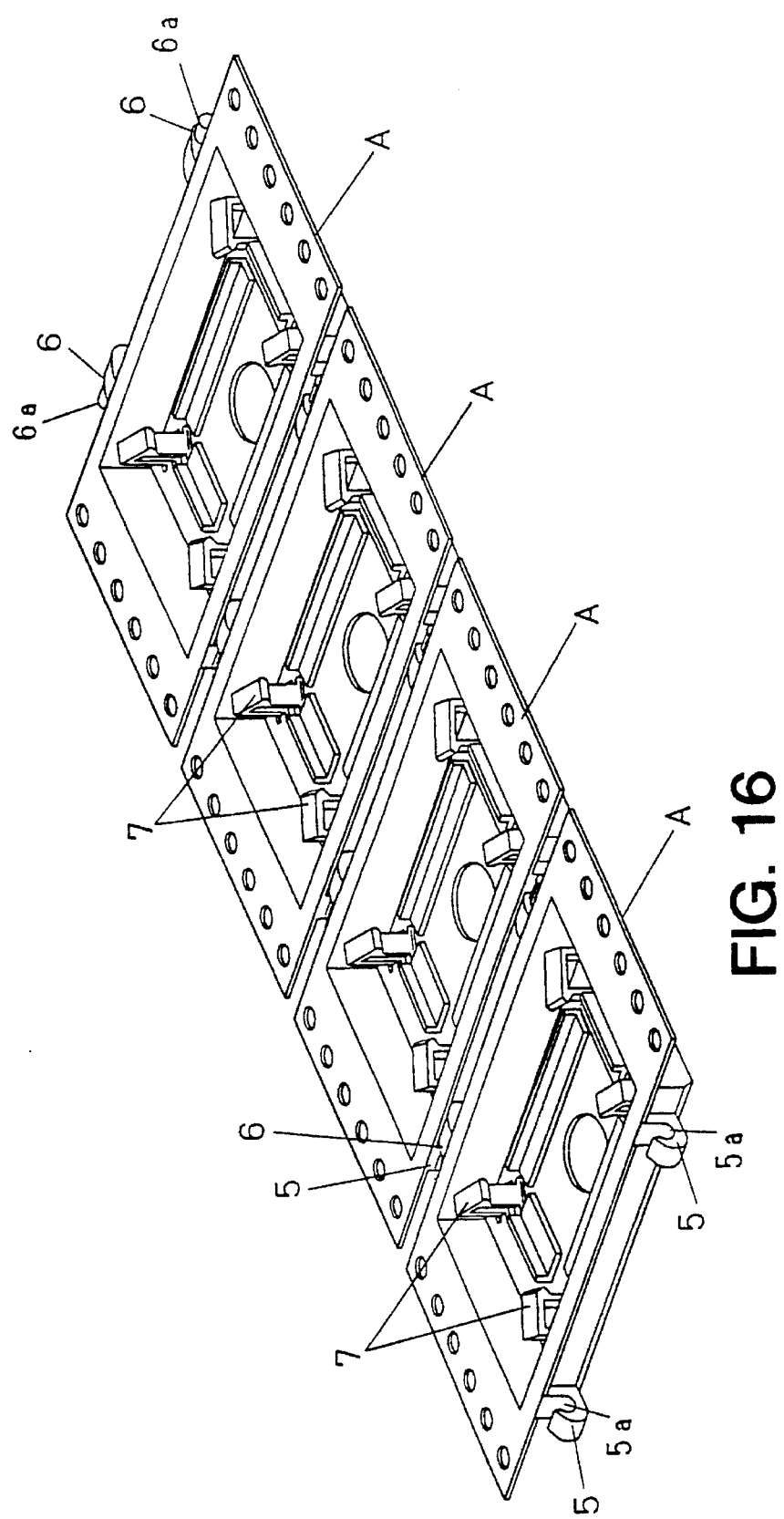
FIG. 16 is a perspective view of an assembly which consists of a plurality of the trays provided in the third embodiment and connected one to another in a chain-like manner.
Figure 17:
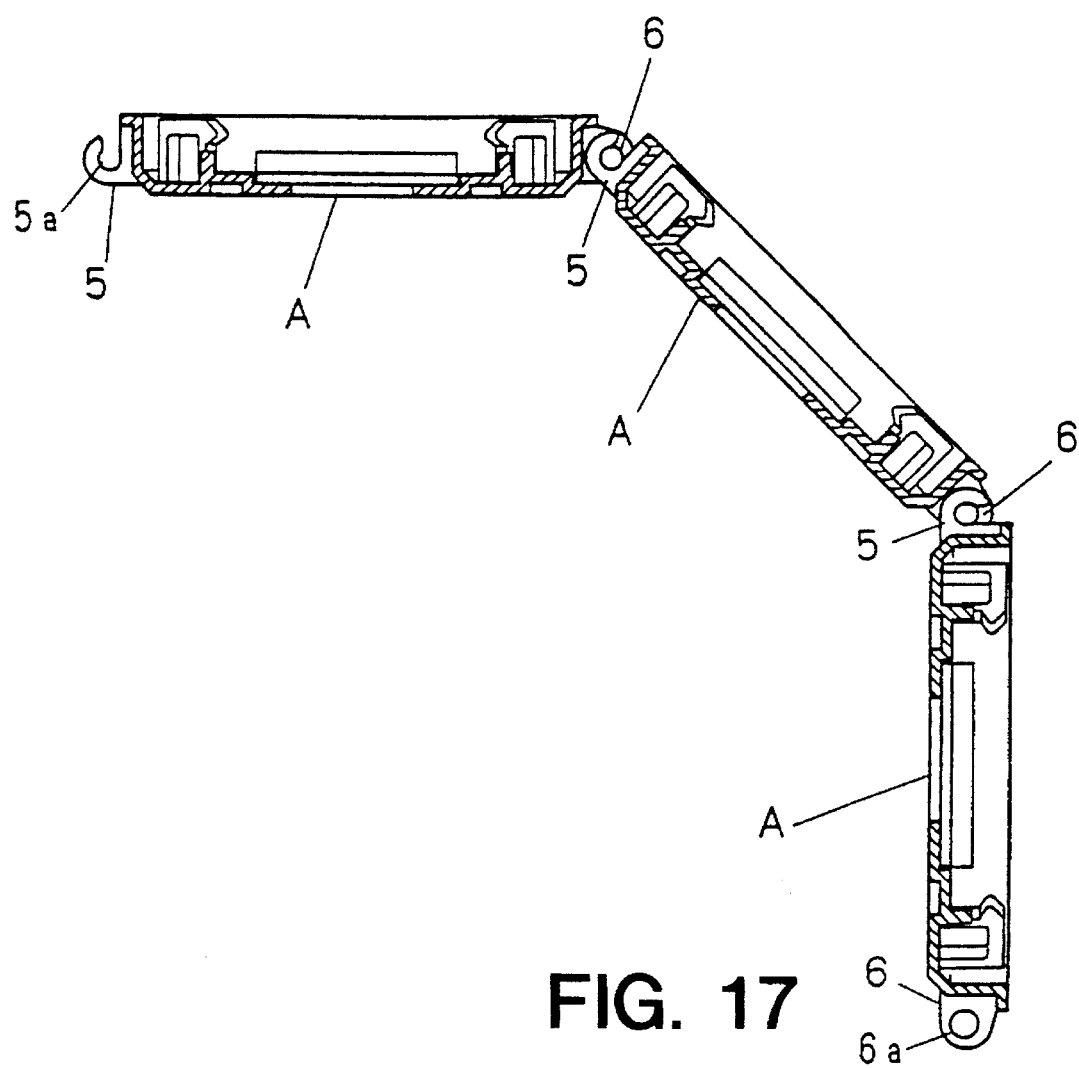
FIG. 17 is a cross section of the chain-like tray assembly provided in the third embodiment and shown in its bent state.

The trays 'A' of the described structure will be linked one to another by the female and male connectors 5 and 6, in a manner as shown in FIGS. 16 and 17 so that the IC chips 'B' may be held in the recesses 1 of trays and transported to the manufacture line. When building an assembly of such trays, a horizontal pin 6a of each male connector 6a will be snapped in a cavity 5a of each female connector 5. Once they are coupled with one another, a constricted opening of each cavity 5a prevents the pin 6a from slipping off during advancement on the manufacture line. However the trays can be separated readily from each other, if necessary, by forcibly raising the pins 6a out of the cavities 5a against an elastic force of the constricted openings.

Figure 18:
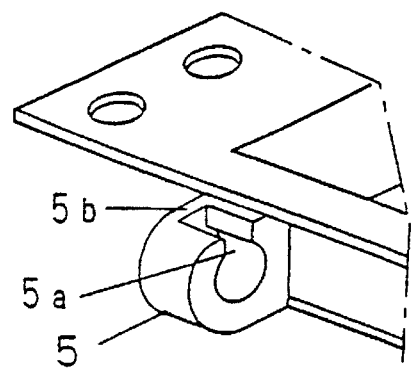
FIG. 18 is a perspective view of a female connector in a fourth embodiment.
Figure 19:
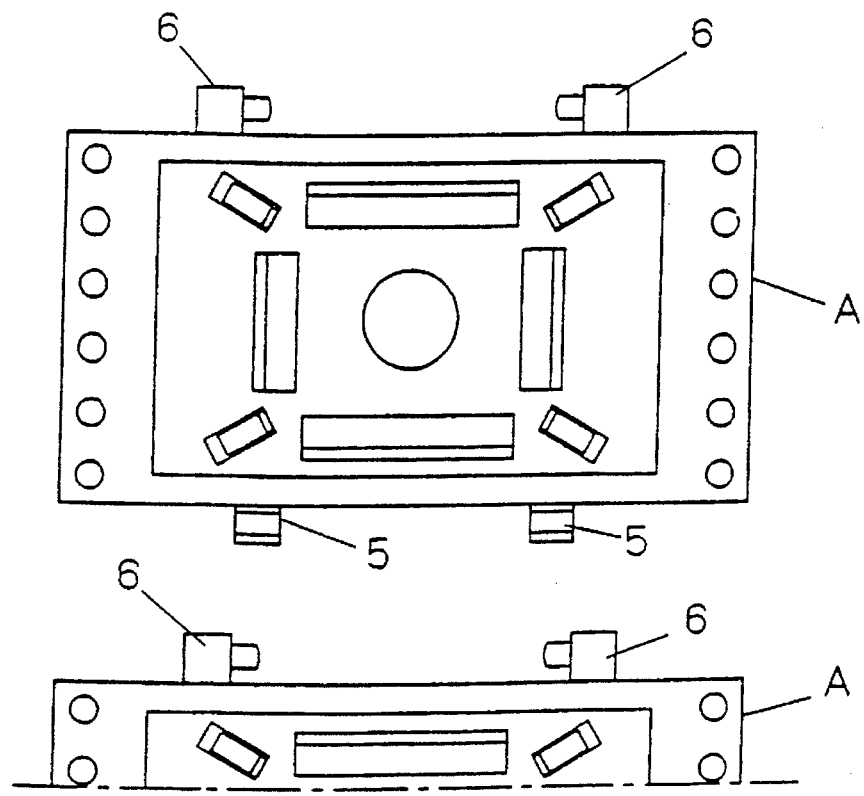
FIG. 19 is a plan view of male connectors in a modification of the third embodiment.

In a fourth embodiment shown in FIG. 18, the female connector 5 is reinforced with a side wall 5b closing one of opposite side openings of the cavity 5a. During use of tray assembly, this side wall will protect the female connector 5 from any deformation resulting in an undesirable disconnection thereof from male connector. Shown in FIG. 19 is a modification of the third embodiment, in which the pins 6a do not protrude in opposite directions but face one another. This modification however does not affect the functions and effects described above in the third embodiment.

The scope of the present invention is not restricted to the described embodiments but may be modified without departing from the spirit of invention. For example, the small apertures 4 through the left-hand and right-hand flanges 3 may be dispensed with. In this case, corner edges of the linked trays 'A' may engage one after another with the sprockets or the like so as to drive the tray assembly.

Figure 8:
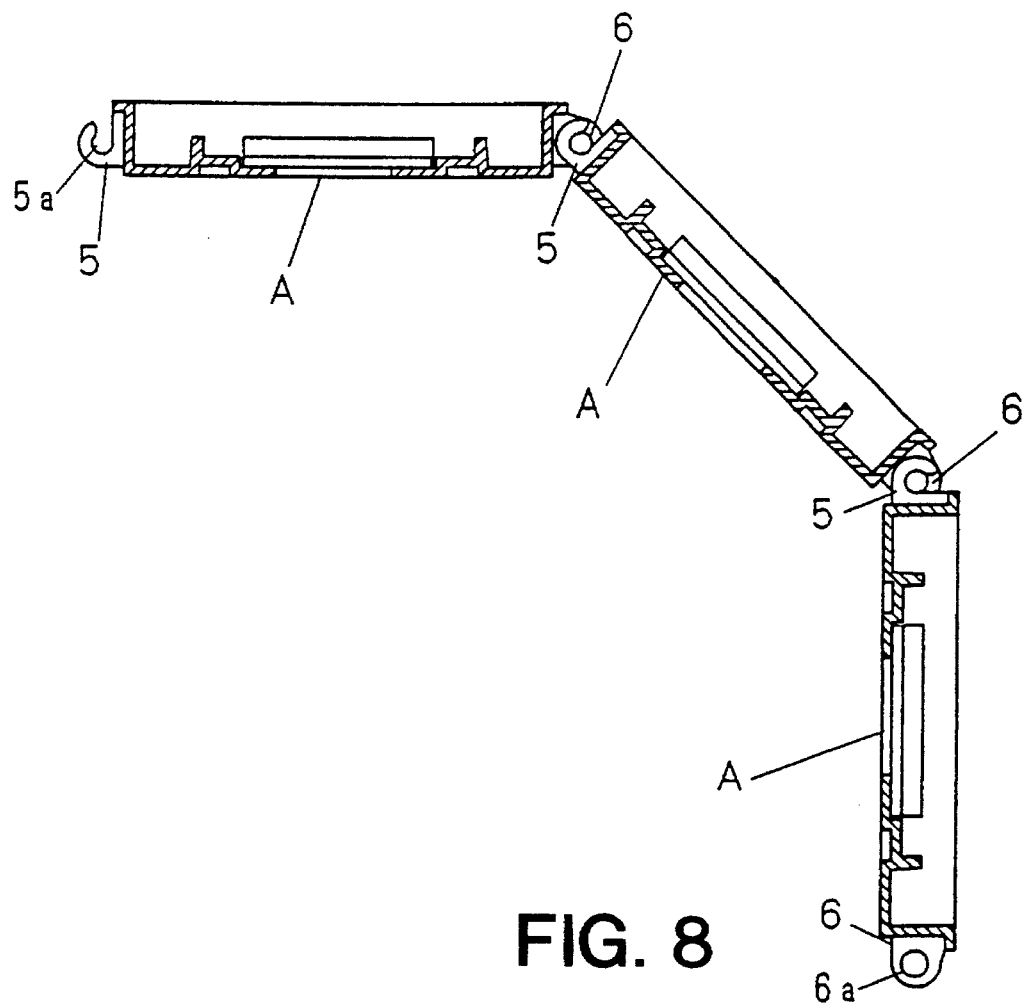
FIG. 8 is a cross section of the chain-like tray assembly, in its bent state.

In summary, the trays are one-piece molds connectable to each other to provide a so compacted chain-like assembly that the robot hand can easily operate within a narrower working area. Particularly, the locking pawls are retracted when the articles are loaded on and unloaded from the tray assembly, so that the robot hand can smoothly put the articles such as IC chips in and out of the trays' recesses. Fine and high precision articles are thus protected from any damage when they are accommodated in or taken out of the trays. Retention of said articles is effected in the present invention not by a simple friction of elastic members urged towards the articles, but by a mechanical engagement of the locking pawls therewith. Therefore, the articles are retained in position more surely not to slip off the tray assembly, even if the latter advances in a bent or reversed position as shown in FIG. 8.

What is claimed is:

1. A tray assembly for transporting precision devices, the assembly comprising a plurality of trays each being a one-piece mold of a plastic material and each having a main body (2), a recess (1) formed between first and second opposite sides of the main body (2) so as to hold an article (B) in place to be transported, male and female connectors (5, 6) integral with the main body, the male and female connectors (5, 6) extending outwardly from the first opposite sides which lie transversely of a direction in which the trays are connected flexibly relative to each other, a pair of rocking plates (13) extending fore and aft or upright along inner surfaces of the side walls (11) and disposed in parallel with the second opposite sides, each rocking plate (13) has a middle portion between its opposite ends formed as a fulcrum (12) extending from the side wall (11), whereby the rocking plates can elastically rock about the fulcrum in a manner like a seesaw, and wherein one of the opposite ends of the plate (13) is shaped as a contact (15) that protrudes outwardly of the recess (1) through an opening (14) formed in the wall, with the other end opposite to the contact (15) being shaped as a rocking pawl (16) that protrudes inwardly of the recess (1) and which is urged towards the article (B) so as to engage the article (B).

2. A tray assembly as defined in claim 1, wherein the elastic rockable means is at least one pair of plate members (7) located diagonally to face one another and formed integral with a bottom (8) of the main body (2), each plate member (7) consisting of a pair of inner and outer elastic feet (7a), a bridge (7b) integral with tops of the feet, and the locking pawl (7c) formed as an inner end of the bridge so as to face a center of the bottom, and wherein the elastic feet (7a) standing upright on the bottom (8) are aligned on a diagonal line and disposed in parallel with each other.

3. A tray assembly as defined in claim 1, wherein each female connector (5) is generally U-shaped in cross section to define a cavity (5a) having a slightly constricted top opening, and each male connector (6) comprising a horizontal pin (6a) which protrudes sideways therefrom and is of such a diameter that it can be forced into the cavity (5a), through the constricted opening thereof.

4. A tray assembly as defined in claim 3, wherein each female connector (5) is reinforced with a side wall (5b) closing one of opposite side openings of the cavity (5a).

5. A tray assembly as defined in claim 2, wherein each female connector (5) is generally U-shaped in cross section to define a cavity (5a) having a slightly constricted top opening, and each male connector (6) comprising a horizontal pin (6a) which protrudes sideways therefrom and is of such a diameter that it can be forced into the cavity (5a), through the constricted opening thereof.

\* \* \* \* \*